June 26, 1962 P. I. PRENTKY 3,041,546

PULSE SYNCHRONIZER

Filed May 3, 1960 6 Sheets-Sheet 1

INVENTOR
P. I. PRENTKY

BY Geoffrey Knight
ATTORNEY

June 26, 1962 P. I. PRENTKY 3,041,546

PULSE SYNCHRONIZER

Filed May 3, 1960 6 Sheets-Sheet 4

June 26, 1962 P. I. PRENTKY 3,041,546

PULSE SYNCHRONIZER

Filed May 3, 1960 6 Sheets-Sheet 6

United States Patent Office 3,041,546

Patented June 26, 1962

3,041,546

PULSE SYNCHRONIZER

Peter I. Prentky, Wappingers Falls, N.Y., assignor to International Business Machines Corporation, New York, N.Y., a corporation of New York Filed May 3, 1960, Ser. No. 26,458
6 Claims. (Cl. 331—12)

Figure 1:
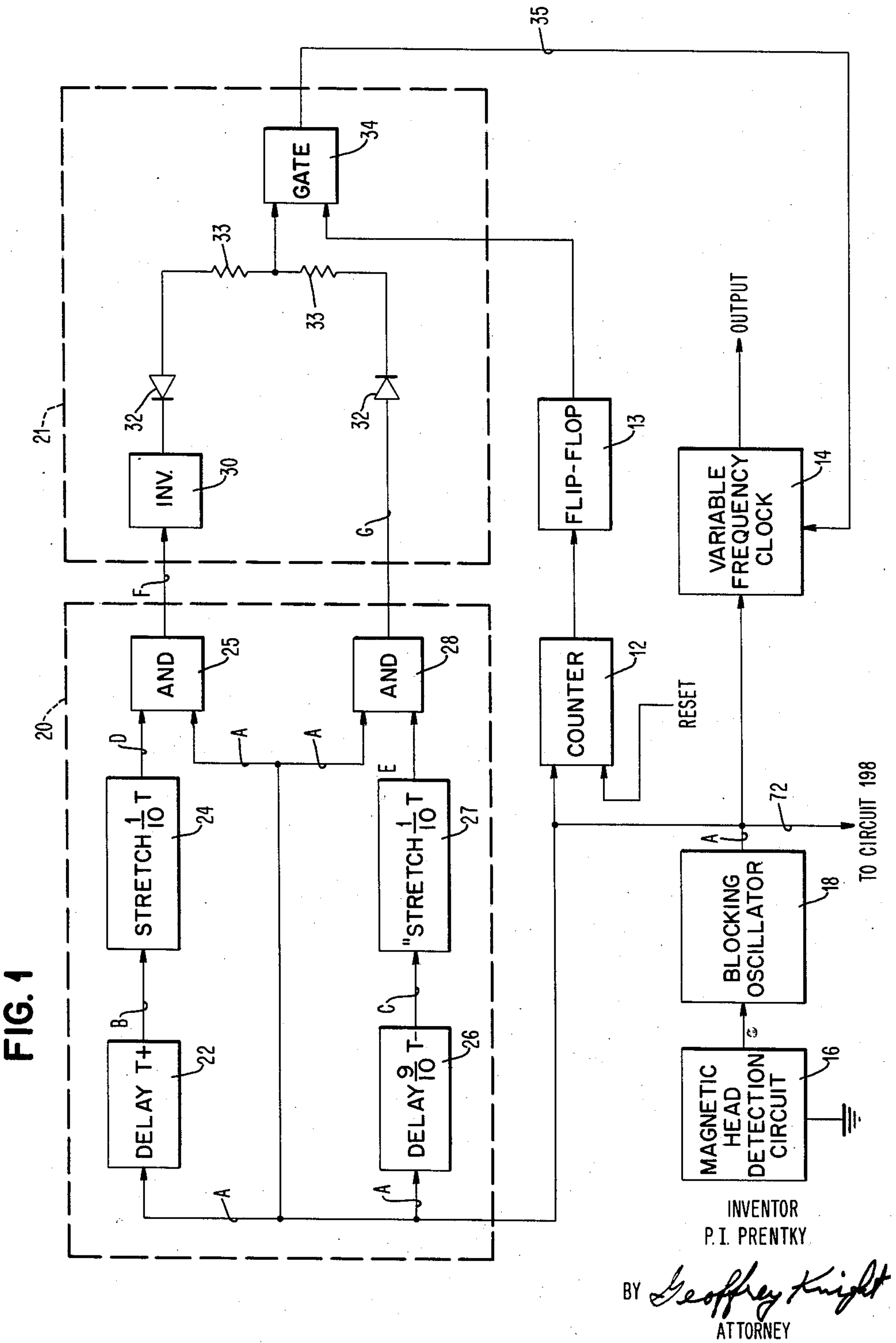

This invention relates to electrical pulse generation and measurement, and more particularly to circuitry for synchronizing a pulse generator with an external pulse source.

Certain systems, for instance the magnetic recording system shown in copending application No. 745,731, Magnetic Recording System, filed June 30, 1958, require circutry for synchronizing an internal variable frequency pulse generator with an external pulse source.

The prior art generally shows two types of circuits for accomplishing the desired synchronization. The first type of circuit actually measures the time separation between the external pulses and accordingly adjusts the frequency of the internal pulse source. Circuits of the above type merely synchronize the frequency of the two pulse sources and they do not establish any particular phase relationship. Furthermore, they are generally complex and expensive.

The second type of circuit, such as that shown in the above referenced copending application, merely compares the phase relationship of the two pulse trains. If the pulses from the external pulse source occur before the pulses produced by the internal pulse source, the frequency of the internal pulse source is increased whereas if the pulses for the external source occur after the pulses from the internal pulse source, the frequency of the internal pulse source is decreased. (It should be noted that for certain particular reasons in the system shown in the above referenced copending application, the phase location of the external pulses is compared and adjusted to coincide with a phase point which is midway between the internal pulses.)

Systems of the second type operate satisfactorily except when the two pulse trains are completely out of synchronization. If the two pulse trains are not approximately synchronized, the fact that a pulse from the external source occurs before a pulse from the internal source does not necessarily mean that the frequency of the external source is greater than the frequency of the internal source, and vice versa.

For the above reason, in the system shown in the above referenced copending application, a time equal to approximately sixteen pulse periods is required to achieve synchronization between the internal and external pulse sources.

It is an object of this invention to provide a circuit for quickly synchronizing two pulse sources.

It is a further object of this invention to provide a circuit for comparing the time relationships of the two pulse trains.

It is a further object of this invention to provide a simple circuit for measuring the time separation of pulses.

It is a further object of this invention to provide a circuit for determining the time separation of pulses relative to a fixed standard.

The foregoing and other objects, features and advantages of the invention will be apparent from the following more particular description of a preferred embodiment of the invention, as illustrated in the accompanying drawings.

In the drawings:

FIG. 1 is a block diagram of an embodiment of the synchronizing circuit which comprises this invention.

Figure 2A:
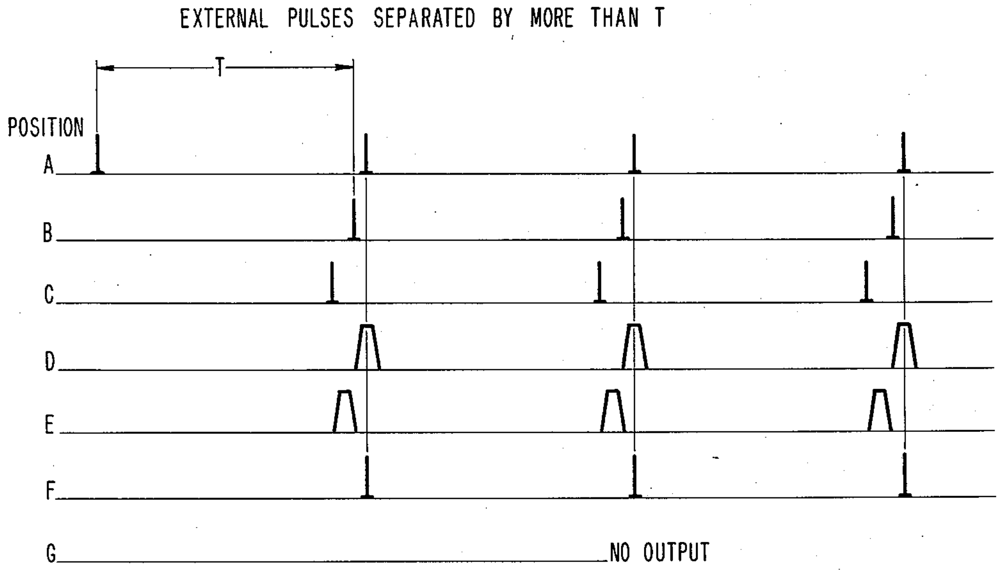
Figure 2B:
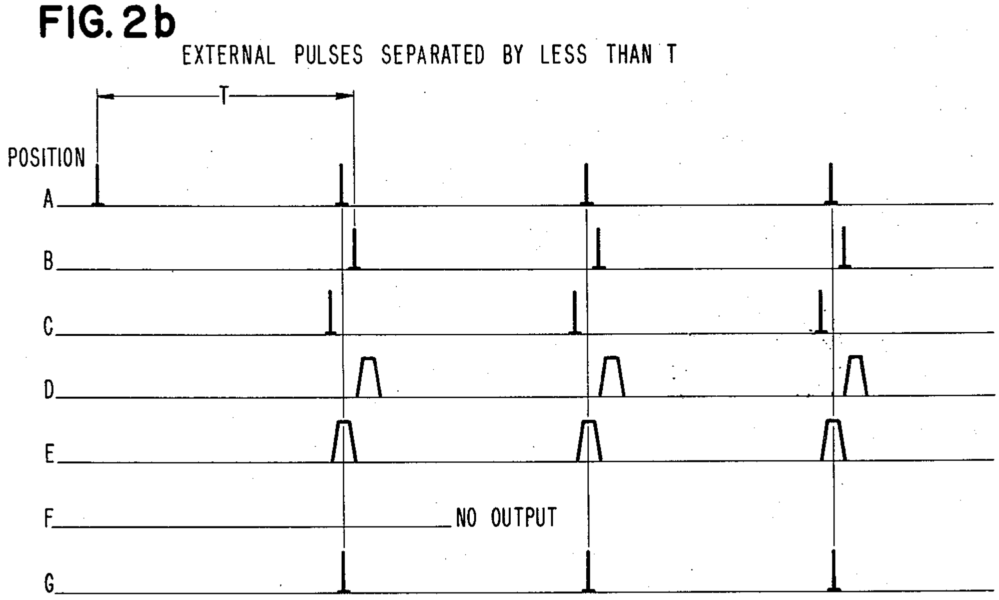

FIGS. 2*a* and 2*b* are timing diagrams of the pulses occurring at various points in the circuit shown in FIG. 1.

Figure 3:
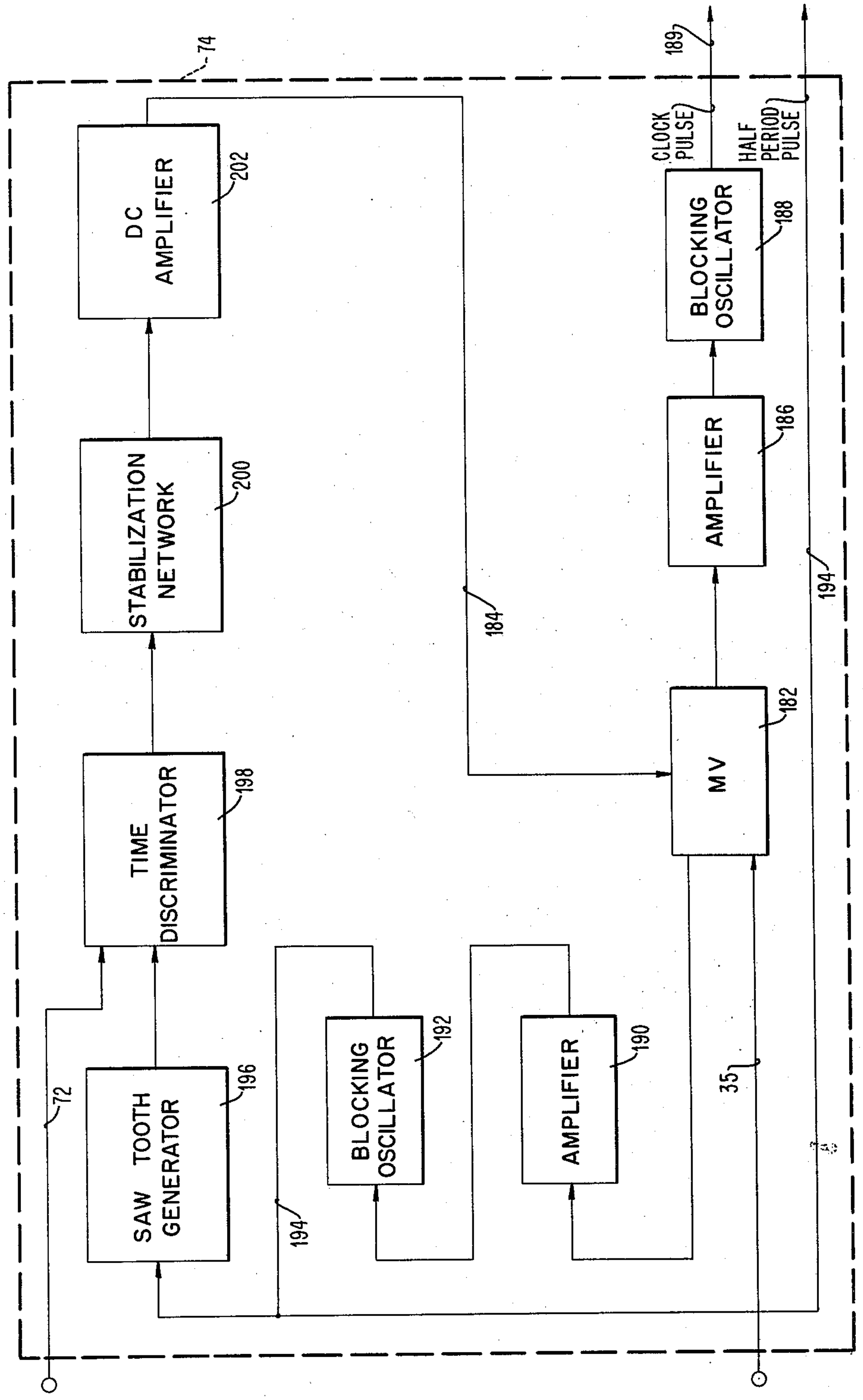

FIG. 3 is a block diagram of the variable frequency clock shown in FIG. 1.

Figure 4A:
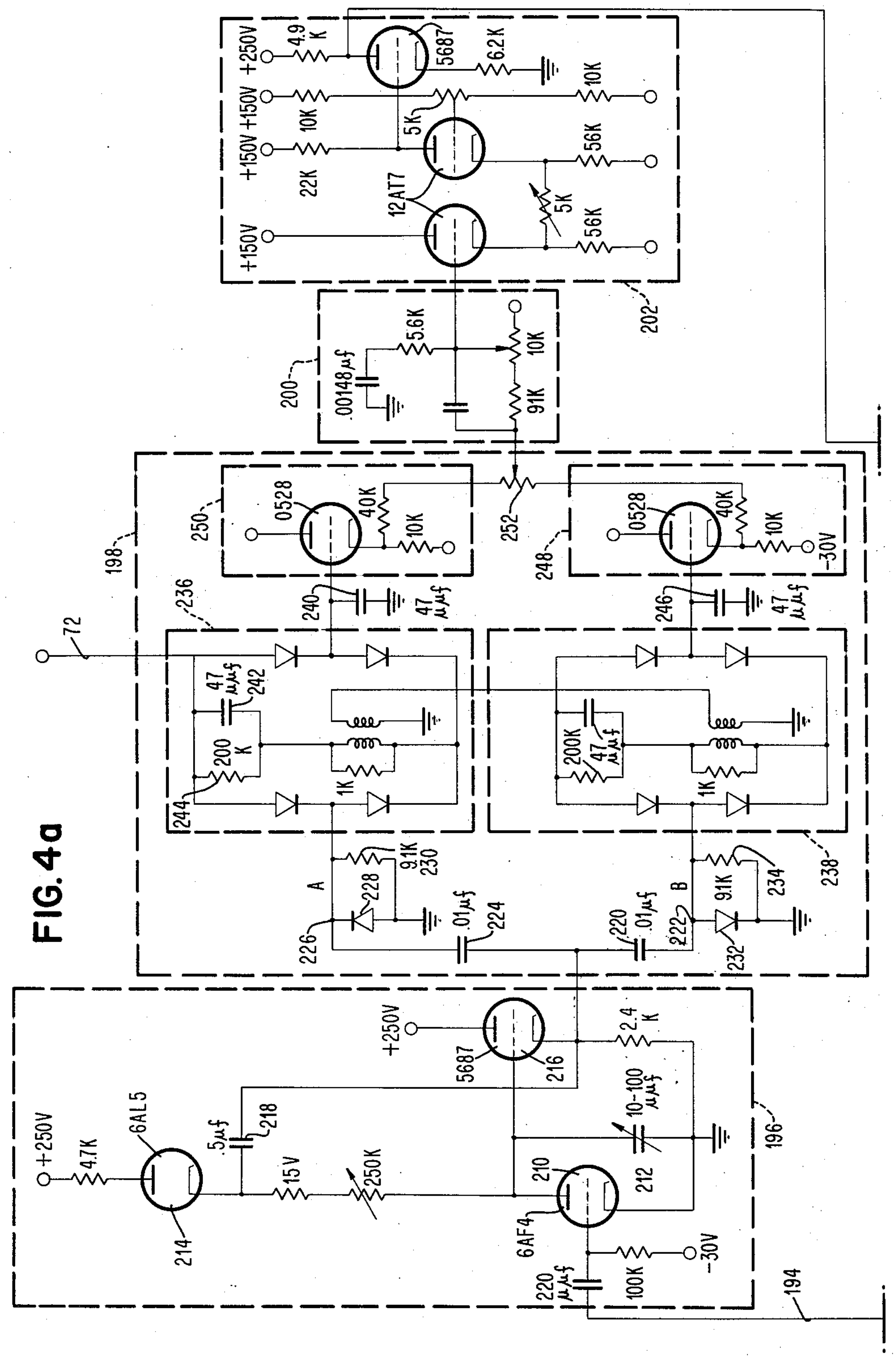
Figure 4B:
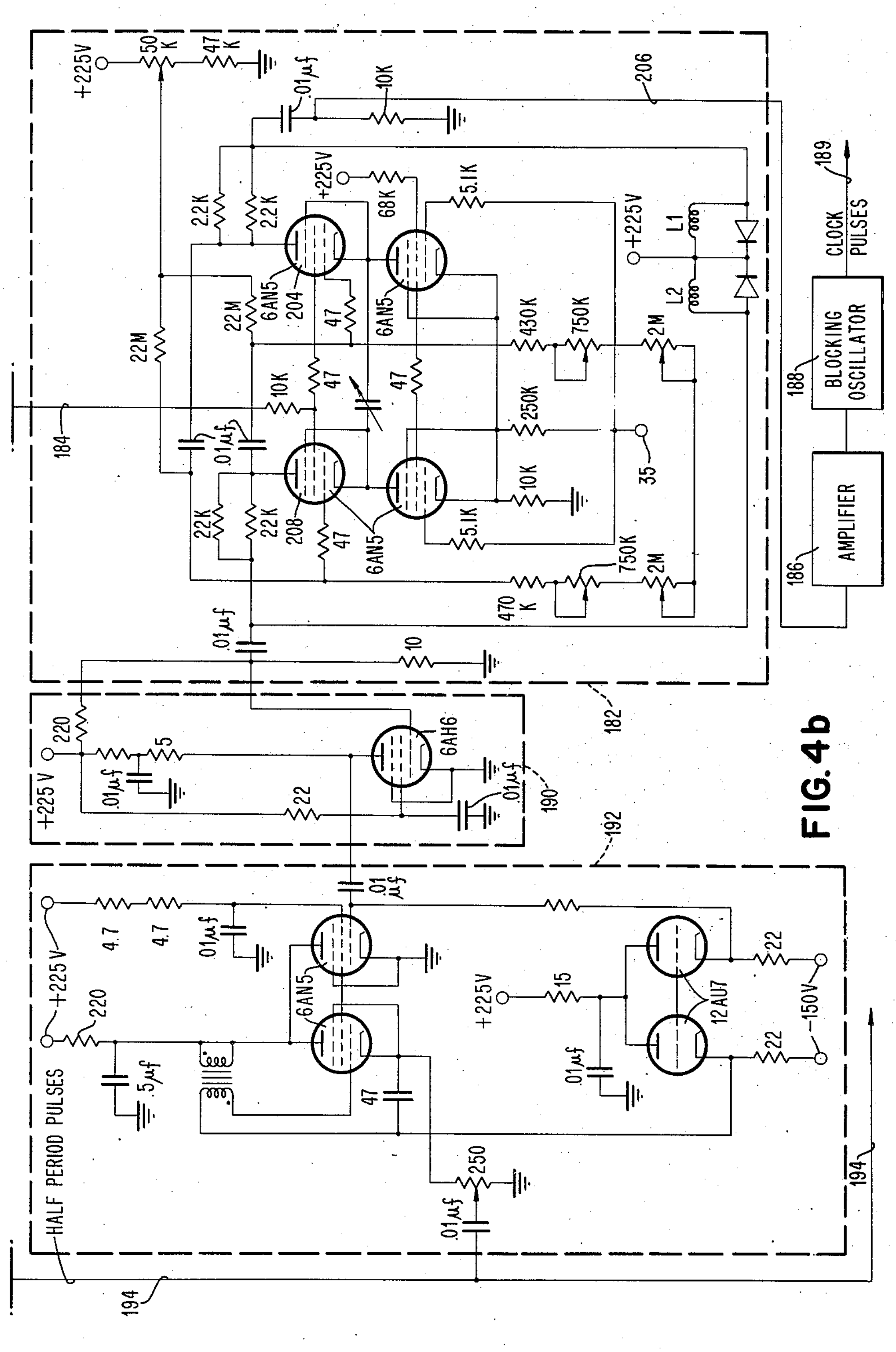

FIGS. 4*a* and 4*b* are circuit diagrams of the variable frequency clock shown in FIG. 3.

FIGS. 5*a*, 5*b*, 5*c*, 5*d*, 5*e* and 5*f* are waveform diagrams for the variable frequency clock shown in FIG. 3.

In general, the synchronizing circuit 20 (FIG. 1), of this invention, determines whether the time delay between the pulses of the external pulse train A is greater or smaller than a certain fixed time period T. The circuit then accordingly adjusts (in a manner to be described) the frequency of a variable frequency clock 14 (the internal pulse source) to conform with the frequency of the external pulse source.

If the time separation between pulses of the external pulse source is greater than T an output will appear at F, while if the separation is less than T, an output will appear at G.

The output indicating that the time separation of the external pulses is greater than T will be produced when there is a coincidence at AND circuit 25 between pulses from the external source which have been delayed by slightly more than T and then stretched by .1T with undelayed and unstretched pulses from the external pulse source (see FIG. 2*a*).

The output indicating that the time separation of the etxernal pulse source is less than T will be produced when there is a coincidence at AND circuit 28 between pulses from the external pulse source which have been delayed by slightly less than .9T and when stretched by .1T with undelayed and unstretched pulses from the external pulse source (see FIG. 2*b*). The above described signals which appear at points F and G are combined by circuit 21 and the output 35 of circuit 21 is used to control the frequency of the internal pulse source.

More specifically, the synchronization circuit of this invention is herein shown as applied to the magnetic recording system shown in copending application 745,731 filed June 30, 1958. The circuit is used to synchronize the frequency of the internal variable frequency clock 14 to the frequency of the external pulse train A. The external pulse train is derived from the reading head of a magnetic tape recording system.

The internal variable frequency clock 14 (FIG. 3), as will be explained in detail later, does have synchronizing means within itself. Said synchronizing means include a sawtooth wave generator 196 which is triggered so that during synchronized operation the external pulses occur in the center of the sawtooth wave. Any deviation therefrom is used as an indication that the frequency of the variable frequency clock is not synchronized with the external pulse source. To wit, if the external pulses fall before the center of the sawtooth wave, the variable frequency clock is adjusted so as to increase its frequency and conversely if the pulses from the external pulse source fall after the center of the sawtooth wave, the frequency of the variable frequency clock is decreased.

Whenever the tape starts moving or whenever the tape changes direction of movement, the phase synchronization is completely lost and hence, the relative position of the external pulses and the center of the sawtooth wave is not a valid indication of the relative frequency of the two sources.

Circuit 20 of this invention does however give a valid indication of the relative frequency during this initial synchronizing period and in the embodiment shown herein, the circuit 20 is caused to be operable only during the initial synchronizing period, to wit, for fifteen pulses.

The counter 12 (FIG. 1), which is reset each time the tape starts or changes direction of movement, counts fifteen pulses and then it switches flip-flop 13, de-energizing the control input to GATE circuit 34, thereby rendering the synchronizing circuit 20 inoperative.

The synchronizing circuit 20 receives pulses from the external pulse source (the magnetic head detection circuit 16) and produces outputs which indicate whether the frequency of the external pulse source is above or below a predetermined frequency 1/T.

Essentially circuit 20 compares the time separation of the pulses which are being read from the tape against a fixed time interval. This fixed time interval, T, is equal to the normal time interval between the pulses produced by the internal pulse source 14. The relative phase relationship between the pulses from the tape and the pulses from the internal source does not enter into the comparison; merely the time interval between the external pulses is considered. If the time interval between the external pulses is greater than the normal time interval between the pulses produced by the internal source, the frequency of the internal source is decreased and vice versa.

The magnetic head detection circuit 16, the construction of which is well known in the art and an example of which is shown in the above referenced copending application, reads the magnetic tape and produces a pulse train herein called the external pulse train, said pulse train having pulses of positive polarity. These external pulses which are relatively wide are made into the sharp positive pulses by blocking oscillator 18. Blocking oscillator 18 operates in the well known manner and is similar to the blocking oscillator 192 shown in FIG. 3.

From blocking oscillator 18 the external pulses are fed into synchronizing circuit 20. Therein, delay circuit 22 delays the external pulses by a time period which is slightly larger than T (herein T plus 50 millimicroseconds and hereinafter called T+). The delay pulses are thereafter stretched by circuit 24 by an amount .1T, and supplied as one input to AND circuit 25. The second input to AND circuit 25 is the undelayed external pulse train. As shown by the timing diagram, FIG. 2*a*, a coincidence of pulses on the inputs to AND circuit 25 indicates that the frequency of the external pulse source is less than 1/T (i.e., that the time separation between pulses is greater than T).

In the second half of circuit 20 the pulses from the external pulse source are delayed by circuit 26, an amount slightly less than .9T (herein .9T—50 mms. and hereinafter called .9T—). Circuit 27 thereafter stretches the delayed pulses by an amount .1T. As shown by the timing diagram, FIG. 2*b*, a coincidence of pulses on the inputs to AND circuit 28 indicates that the frequency of the external pulse source is more than 1/T (i.e., that the time separation between pulses is less than T).

FIG. 2*a* shows the effect of the external pulse source being slower than normal, i.e., the external pulses being too widely separated. It is seen that when each pulse in such a pulse sequence is delayed by a time T+ and stretched by a time .1T, each pulse so delayed and stretched will be coincident with the next succeeding pulse in the original pulse train. Furthermore, when each pulse in such a pulse train is delayed by only .9T— and then stretched by .1T, such a pulse will not be coincident with the next succeeding pulse of the original pulse train.

FIG. 2*b* shows the effect of the external pulse source being faster than normal, i.e., the external pulses being too closely separated. When each pulse of such a pulse train is delayed by T+ and stretched by .1T, each pulse so delayed and stretched is not coincident with the next succeeding pulse in the original pulse train. However, when pulses are delayed by .9T— and then stretched by .1T they will each respectively be coincident with the next succeeding pulse in the original pulse chain.

The amount which the pulse trains are delayed and stretched depends upon the variation which is expected in the operation of the pulses which are being examined. In the embodiment described herein, the greatest variation expected is ten percent and the networks were designed accordingly. Furthermore, in order to avoid spurious signals due to the rise time and the decay time of the pulses, circuit 25 delays the pulses slightly more than T (T+50 mms.) and the combination of the delay by circuit 26 and stretching by circuit 27 is slightly less than T (T—50 mms.). It can be seen that this will prevent circuits 25 and 28 from giving outputs when the time separation of the external pulses is so near T that the rise time and decay time of the pulses would be significant.

The design of the pulse stretching circuit shown is well known in the art and is discussed in many of the well-known text books such as Electronic Engineering by Samuel Seeley, McGraw-Hill Book Company, 1956. Delay circuits such as that shown are also well known in the art, and the design considerations are discussed in well-known text books such as Pulse and Digital Circuits by Jacob Millman, and Herbert Taub, McGraw-Hill Book Company, 1956.

As will be explained later, the frequency of the internal pulse source 14, is controlled by input line 35, a positive voltage signal thereon increasing the frequency and a negative signal thereon decreasing the frequency. In order to control the internal pulse source, it is necessary to combine the outputs of circuits 25 and 28 as is done in circuit 21 thereby producing a signal output 35.

A positive output signal from circuit 25 indicates that the frequency of the internal pulse source is too fast, whereas it is necessary to have a negative signal on input line 35 to decrease the frequency of the internal pulse source. Hence, inverter circuit 30 is used to invert the output voltage of circuit 25. Diodes 32 and resistors 33 isolate the outputs of circuits 28 and 30.

GATE circuit 34 renders synchronizing circuit 20 operative only before the fifteen pulse counter 12 has deactivated the flip-flop 13, thereby cutting off the control input to GATE circuit 34. Hence, circuit 20 is only operative during the first fifteen pulses read by circuit 16.

A block diagram of the variable frequency clock 14, with its internal synchronizing circuit is shown in FIG. 3. The multivibrator pulses initiate a sawtooth wave which is combined in a time discriminator 198 with the external pulses coming from the tape. Each of the external pulses should fall in the center of the sawtooth wave. If they begin to fall before the center of the sawtooth wave, it is an indication that the pulses are coming earlier, i.e., that the frequency of the external pulse source is higher than the normal value 1/T. The time discriminator 198 then signals the multivibrator 182 to increase its frequency. Conversely, if the external pulses begin to fall after the center of the sawtooth wave, the time discriminator 198 signals the multivibrator 182 to decrease its frequency.

As previously described, the synchronization circuit shown in FIG. 3 operates satisfactorily except when the two pulse trains are completely out of phase so that the relative position of the center of the sawtooth wave with respect to the external pulses is meaningless.

Multivibrator 182 is of the standard type. The multivibrator operates so that an increase in voltage on either lead 184 or lead 35 will cause an increase of frequency in the multivibrator 182 and a decrease in voltage therein will cause a decrease in frequency.

A multivibrator is a device which produces a square wave output on each of its output terminals, its left-hand output being 180° out of phase with its right-hand output. The right-hand output from the multivibrator 182 is fed via an amplifier 186 to a blocking oscillator 188. The blocking oscillator produces a sharp positive pulse on line 189 at a time coincident with the rise in voltage of the right-hand output square wave. The output of the blocking oscillator is therefore a sharp positive pulse hereinafter described as a clock pulse.

The circuitry which regulates the frequency of the multivibrator 182 during normal operation (i.e., after counter 12 has rendered circuit 20 inoperative) will now be explained in detail.

The left hand output of multivibrator 182 is fed through an amplifier 190 and a blocking oscillator 192 to a half-period pulse lead 194 which therefore falls halfway between the clock pulses. The half-period pulse lead 194 is fed to a sawtooth generator 196 in which each half-period pulse starts the rise of a sawtooth wave. The sawtooth wave is fed to one input of a time discriminator 198, the other input of which is the lead 72 which carries sharp positive pulses representative of the external pulses from the tape.

Ordinarily a pulse on lead 72 falls in time at the center of the sawtooth wave. If this condition continues, the output of the time discriminator, which is at an average D.C. value, remains unchanged. This unchanged average D.C. value is fed through a stabilizing network 200 and a D.C. amplifier 202, the output of which is also the unchanged average D.C. value on lead 184 which controls the frequency of the multivibrator 182. Since the value of the D.C. voltage on lead 184 and the condition in the situation being described is unchanged, the frequency of multivibrator 182 remains unchanged.

Figure 5A:
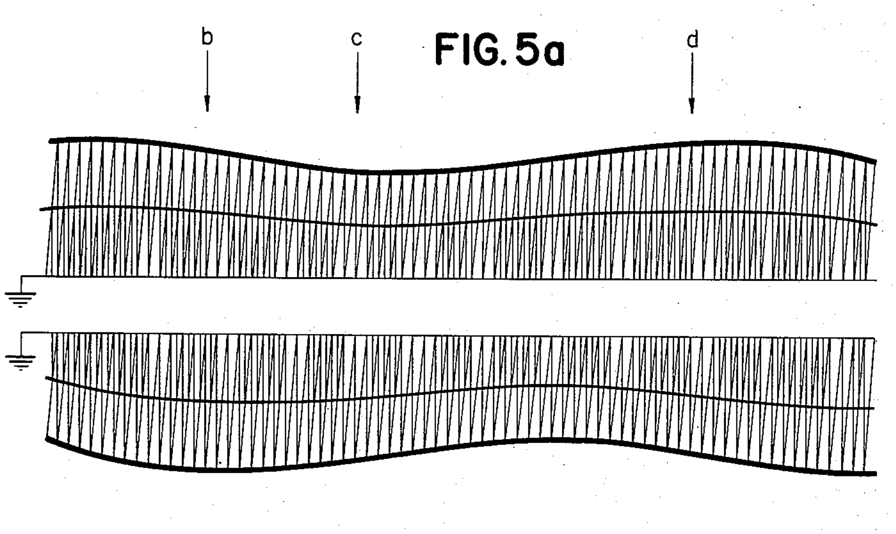
Figures 5B, 5C, 5D:
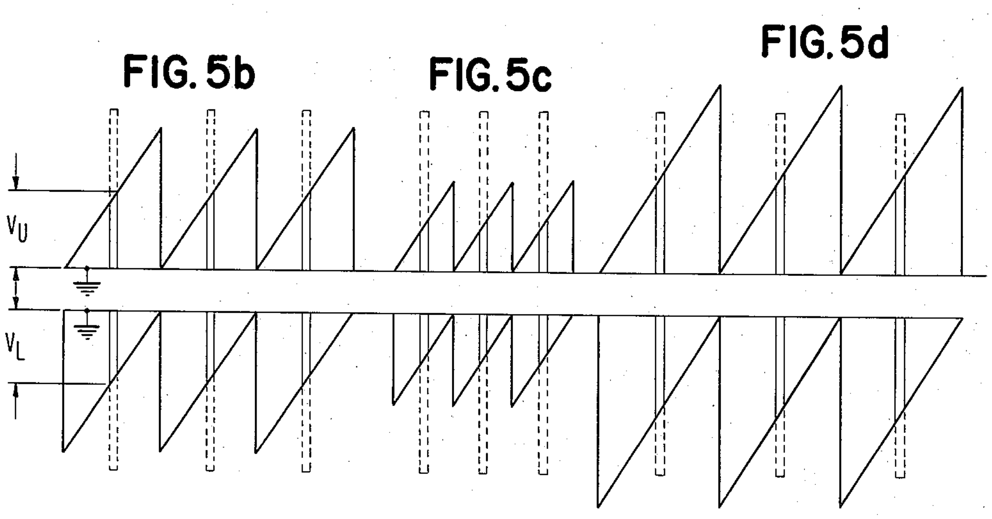

FIG. 5*b* illustrates the sawtooth wave and the pulse coming at the average frequency so that the pulses fall in the center of the sawtooth wave.

When the frequency at which the pulses arise has increased, the pulses will be displaced to the left with respect to the center of the sawtooth wave (see FIG. 5*e*), it is then necessary to increase the frequency of multivibrator 182. This is accomplished within the time discriminator 198, wherein the voltage at the output of the time discriminator 198 decreases. This will cause the voltage at the output of the D.C. amplifier 202 to increase the frequency of multivibrator 182. The increase in frequency means that the half-period clock pulses on lead 194 start coming at a faster rate. Thus, the sawtooth generator produces sawtooth waves of shorter time duration, that is, of narrower width. At the point where the external pulses once again fall in the center of the narrowed sawtooth wave as in FIG. 5*c*, the frequency of the multivibrator stops changing at its new increased frequency.

Figure 5E:
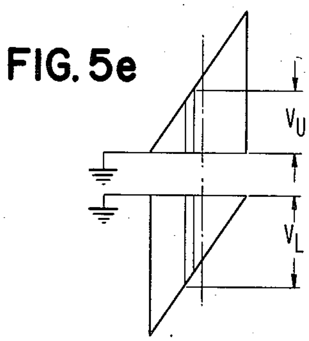
Figure 5F:
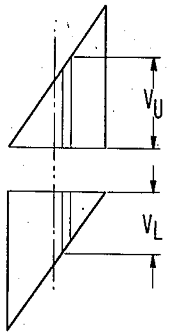

FIG. 5*f* is an example of external pulses starting to come at a slower rate than the multivibrator frequency and therefore the external pulses are shifted slightly to the right of the center of the sawtooth wave. This condition is recognized by the time discriminator 198 which produces an increased voltage at the output of D.C. amplifier 202 on the lead 184 to decrease the frequency of multivibrator 182. The decreased multivibrator frequency causes an increased spread in the half-period pulses on lead 194 which produce wider sawtooth waves. When the pulses on lead 72 finally fall in the center of the increased width sawtooth wave, as shown in FIG. 5*d*, the multivibrator frequency stops changing at its new decreased frequency.

FIGS. 4*a* and 4*b* show the details of the block diagram of FIG. 3. The multivibrator 182 (FIG. 4*b*) has a tube 204, the plate of which provides clock pulses on the lead 189 via lead 206, the amplifier 186 and the blocking oscillator 188. Half-period pulses taken from the plate of a tube 208 of the multivibrator 182 are fed via the amplifier 190 and the blocking oscillator 192 to the half-period pulse lead 194.

The details of amplifier 190 are shown in FIG. 4*b* and since amplifiers of this type are well known in the art, no further description will be given. The amplifier 186 is a similar type amplifier. Blocking oscillator 192 is shown in detail in FIG. 4*b* and since it too is of a type well known in the art, no further description will be given. Blocking oscillator 188 is the same type of oscillator as blocking oscillator 192.

Half-period pulses on lead 194 in FIG. 4*a* appear at the grid of a tube 210 of the sawtooth generator 196 and causes tube 210 to conduct, discharging condenser 212. It will charge again through a tube 214 and the charging rate is linear due to feedback from the cathode of a tube 216 through a condenser 218 to the cathode of the tube 214. When condenser 212 starts to charge, the grid of tube 216 is at ground potential. As condenser 212 charges, the grid of tube 216 rises in voltage, which also causes its cathode to rise. This rising voltage is transmitted to the cathode of tube 214 and the effect of this is to make the charging rate of condenser 212 substantially linear. At some point during the charging of condenser 212 and before it is fully charged, the next half-period pulse appears on the grid of the tube 210 causing condenser 212 to discharge. The result of this action is a sawtooth wave at the cathode of tube 216.

The sawtooth wave is transmitted through a condenser 220 to a point 222 and also through a condenser 224 to a point 226. At point 222, the top of the sawtooth wave is clamped to ground and at point 226, the bottom of the sawtooth wave is clamped to ground by a diode 228 and a resistor 230. The resistor 230 is needed in order to insure that one side of the condenser 224 goes to ground potential at the fall of the sawtooth pulse. A diode 232 and a resistor 234 perform a similar function in clamping the top of the sawtooth wave to ground to point 222.

FIGS. 5*a* through 5*f* indicate two sets of sawtooth waves. In each of these figures, the upper wave has its bottom clamped to ground and the lower wave has its top clamped to ground. The use of the two sawtooth waves performs a balancing function which compensates for any non-linearity that remains in the sawtooth wave and any variations in the sawtooth voltage. Point 226 is connected to a bi-directional switch 236, and point 222 is connected to a bi-directional switch 238. Bi-directional switches of this type are described in a book entitled Waveforms, volume 19 of the Radiation Lab Series.

Only the effect of these bi-directional switches 236 and 238 will be described, and their use can be understood by reference to FIGS. 5*a* through 5*f*. Referring to FIG. 5*b*, the condition is shown in which the frequency of the information pulses as received from the tape agrees with the frequency of the sawtooth wave. The bi-directional switch 236 samples a short portion of the information pulse and the sawtooth wave, the bottom of which is clamped to ground. The output of sawtooth 236 is a voltage $V_U$ which is applied to a condenser 240 (FIG. 4*a*). It should be pointed out that the output of switch 236 is not a series of voltage pulses obtained by sampling the sawtooth wave but is rather a continuous voltage, the value of which is continuously adjusted. This property of switch 236 is obtained by a condenser 242, resistance 244 and the condenser 240, which try to maintain the output voltage of switch 236 at a value determined by the last comparison made between an information pulse and the sawtooth wave. This feature may be known as "frequency memory," the purpose of which is to maintain the voltage $V_U$ during which there are no pulses from the tape.

The lower portion of FIG. 5*b* shows that the bidirectional switch 238 samples the sawtooth wave, the top of which is clamped to ground to produce a voltage $V_L$ which, in the case where the frequency of the information pulses agrees with the frequency of the clock, is equal to $V_U$ but of opposite polarity. Thus the voltage transmitted to a condenser 246 (FIG. 4*a*) will be the same value but of opposite polarity as the voltage on condenser 240. A cathode follower 248 will thus conduct in a manner which keeps its cathode a certain voltage below ground while a cathode follower 250 will conduct in a fashion to keep its cathode the same voltage above ground. With these conditions, the mid-point of a resistor 252 connected between the cathode followers 248 and 250 will be at ground potential, and thus ground potential will be applied to the input of the D.C. amplifier 202 through the stabilizing network 200. The output of the D.C. amplifier 202 which appears on lead 184 will thus be at its average value and consequently the frequency of the multivibrator will be at its average value. The stabilizing network 200 comprises a low pass filter, the purpose of which is to make the variable frequency clock insensitive to phase jitter, phase jitter being compensated in another part of the circuit.

Referring to FIG. 5*e*, it can be seen how an increase in frequency of the external pulses will cause a corresponding increase in frequency of the clock. The bi-directional switches 236 and 238 no longer sample the sawtooth wave at its mid-point, but to the left of the mid-point, thus causing $V_L$ to become greater than $V_U$. The effect of this is to increase the voltage on the mid-point of resistor 252 (FIG. 4*a*) to some value below ground. This will cause the voltage output of amplifier 212 to increase, as hereinbefore mentioned. An increase in voltage on lead 184 will cause an increase in frequency of multivibrator 182 until the condition of FIG. 5*c* is reached.

FIG. 5*f* shows how, in the case of a decrease in the frequency of the external pulse source the voltage $V_U$ becomes greater than $V_L$. This results in a rising of potential on the mid-point of resistor 252 (FIG. 4*a*) to some value above ground. This in turn causes the voltage of lead 184 to decrease, casing a decrease in the frequency of multivibrator 182.

During the time that counter 12 renders circuit 20 operative, the changes in frequency due to changes in voltage on lead 35 essentially override the frequency changes introduced by voltage changes on lead 184.

While the invention has been particularly shown and described with reference to a preferred embodiment thereof, it will be understood by those skilled in the art that various changes in form and details may be made therein without departing from the spirit and scope of the invention.

I claim:

1. In a device for synchronizing the phase and frequency of an internal pulse source with the phase and frequency of an external pulse source, a first regulating circuit to determine if the frequency of the external pulses is above or below the frequency 1/T, said circuit comprising means for delaying each external pulse for a time interval longer than T, first pulse stretching means for stretching each delayed pulse, means responsive to the coincidence of an external pulse and a delayed and stretched pulse for producing a first regulating voltage, means for delaying said external pulse for a time interval shorter than T, second pulse stretching means for stretching said last-mentioned delayed pulses, second regulating voltage producing means responsive to the coincidence of said last-mentioned delayed and stretched pulses and said external pulses, for producing a second regulating voltage, and means under control of the first and second regulating voltage producing means for controlling the rate at which the internal pulse producing means produces pulses.

2. A device as recited in claim 1 which includes a second regulating circuit comprising means controlled by said internal pulse producing means for generating a source sawtooth wave, means for superimposing the external pulses upon said sawtooth wave, means for comparing the position of the external pulses with respect to the sawtooth wave, and means under control of the comparing means for controlling the pulse rate of the internal pulse producing means.

3. A device as recited in claim 2 which includes counting means for counting said external pulses and means for rendering said first regulating circuit effective to regulate the frequency of said internal pulse source only for a specified number of external pulses.

4. In a device for comparing the time separation between the pulses from a pulse source to a fixed time T, means for delaying said pulses for a time T, means for stretching said delayed pulses for a time period Y, the time period Y being much shorter than the time period T, means responsive to the coincidence of said delayed and stretched pulses and said original pulses for producing an indication that the time between said original pulses is more than T, means for delaying said pulses for time $T-X$, time period X being much smaller than the time period T, means for stretching last-mentioned delayed pulses for a time period X, and means responsive to the coincidence of said last-mentioned delayed and stretched pulses and to said original pulses for producing an indication that the time separation between said original pulses is less than T.

5. In a device for altering the frequency of a pulse source in response to the time separation between first and second successive pulses being greater than a specified time, the combination of means for delaying the first pulse for said specified time, means for stretching said delayed pulse, and means responsive to the coincidence of said delayed and stretched pulse and said second pulse for altering the frequency of said pulse source.

6. In a device for altering the frequency of a pulse source in response to the time separation between first and second successive pulses being less than a specified time, means for delaying the first pulse for a time less than said specified time, means for stretching said delayed pulse, the total of said delay time and said stretching time being less than said specified time, and means responsive to the coincidence of said delayed and stretched pulse and said second pulse for altering the frequency of said pulse source.

References Cited in the file of this patent

UNITED STATES PATENTS

| | | |
|---|---|---|
| 2,413,023 | Young | Dec. 24, 1946 |
| 2,604,592 | Levine | July 22, 1952 |

FOREIGN PATENTS

| | | |
|---|---|---|
| 583,894 | Great Britain | Jan. 2, 1947 |